United States Patent [19]

Ambrogio

[11] Patent Number: 4,886,162

[45] Date of Patent: Dec. 12, 1989

[54] CONTAINER FOR VACUUM STORING AND/OR SHIPPING SILICON WAFERS

[75] Inventor: Sala Ambrogio, Agrate Brianza, Italy

[73] Assignee: SGS-Thomson Microelectronics S.p.A., Cantania, Italy

[21] Appl. No.: 151,454

[22] Filed: Feb. 2, 1988

[30] Foreign Application Priority Data

Feb. 6, 1987 [IT] Italy ............................. 20755/87[U]

[51] Int. Cl.⁴ ............................................ B65D 73/02
[52] U.S. Cl. .................................... 206/328; 206/334; 206/303; 206/454; 206/455; 206/524.8; 220/4 A
[58] Field of Search ............... 206/328, 234, 486, 490, 206/303, 309, 311, 312, 445, 454, 455, 524.8; 220/4 E, 4 B

[56] References Cited

U.S. PATENT DOCUMENTS

| | | |
|---|---|---|
| 1,370,294 | 3/1921 | Dumons .............................. 206/486 |
| 3,109,539 | 11/1963 | Turoff ................................. 206/312 |
| 3,661,253 | 5/1972 | Cronkhite ........................... 229/2.5 |
| 3,850,296 | 11/1974 | Hirata el al. ....................... 206/234 |
| 3,949,872 | 4/1976 | Paudras .............................. 206/312 |
| 4,057,142 | 11/1977 | Lehner et al. ...................... 206/332 |
| 4,120,398 | 10/1978 | Braddon, Sr. ...................... 206/303 |
| 4,387,807 | 6/1983 | de la Rosa .......................... 206/312 |
| 4,470,508 | 9/1986 | Yen ..................................... 206/334 |
| 4,499,996 | 2/1985 | Coyle .................................. 206/303 |
| 4,511,038 | 4/1985 | Miller et al. ....................... 206/332 |
| 4,694,957 | 9/1987 | Ackeret .............................. 206/309 |

Primary Examiner—David T. Fidei
Attorney, Agent, or Firm—Ladas & Parry

[57] ABSTRACT

A container specifically designed for vacumm holding and shipping a silicon wafer, is provided with two circular portions having circumferentially, on bulged top and lower faces outer rasied edges and, within the top face of the circular portion forming the bottom portion of the assembled container, an inner edge.

5 Claims, 2 Drawing Sheets

CONTAINER FOR VACUUM STORING AND/OR SHIPPING SILICON WAFERS

BACKGROUND OF THE INVENTION

The present invention relates to a silicon wafer holding container, specifically designed for vacuum storing and/or shipping silicon wafers and having particularly useful characteristics.

As is known, silicon wafers or slices, used for making IC's, are thinned, at the end of the processing thereof, to a thickness of 300 microns, electrically tested and then sent to the assembling operations. Frequently these steps are carried out after a long time from the processing and testing operations, and, accordingly, the silicon wafers must be stored for a given time; moreover the assembling place is frequently very spaced from the place of manufacture and, because of this reason, the silicon wafers must be shipped in a very safe condition.

In both cases there are necessary wafer holding elements or containers which must meet some precise requirements, that is:
(a) they must be of the vacuum type, in order to prevent the wafer from absorbing moisture;
(b) they must be mechanically strong and protective, for properly protecting the thin and brittle silicon wafers;
(c) they must have minimum weight and size, to reduce to a minimum the shipping cost;
(d) they must be made of inert materials, in order to not contaminate the wafers, and must be constructed so as to not contact, or contact in a minimum degree, the two faces of the silicon wafers, in order not to contaminate them;
(e) they must not impose electrostatic charges on the wafers.

There are commercially available some wafer containers which, on the other hand, do not possess all of the above stated requirements; for example these known containers release metal impurities (such as sodium, potassium), thereby damaging the wafers, or contact the silicon wafers in several points, thereby preventing them from being vacuum packaged, or have high size and cost as well as can be hardly vacuum packaged in an automatized way.

An object of the present invention is to provide a wafer container which may be easily vacuum packaged, which is capable of properly mechanically protecting the thin silicon wafers, which is provided with suitable antistatic characteristics, which does not contaminate the silicon wafers and which, moreover is capable of also storing partial or not complete silicon wafers.

This and other objects of the invention will become more apparent to those skilled in the art from the following description.

SUMMARY OF THE INVENTION

The wafer container, specifically designed for storing and shipping silicon wafer, according to the present invention is essentially characterized in that it comprises two like diameter circular portions, each of which is provided, on a face thereon, with raised edges arranged at different distances from the center of said face and, on the top face of the portion provided for forming the bottom portion of the container, with a small inner edge having a smaller height than that of the outer edge and contacting it.

The face having the second edge is that provided with the greater diameter outer edge.

Moreover, the two edges formed on the face of the container are interrupted at one point and continue at another point, arranged at a first distance from the first, thereby defining an opening which, with the container in an assembled condition, will be arranged on the side of said container so as to afford the possibility of forming vacuum therein.

By coupling the two faces, one with the greater diameter outer edge and the other with the smaller diameter outer edge, pertaining to two different circular portions, the container will be formed in a ready for use condition and, in this case, the outer edge arranged on the inner face of the top portion will be located at an opposite position from the inner edge of the bottom portion.

As the silicon wafer is arranged in the container, the wafer will be supported, exclusively at its peripheral portion, on the smaller diameter inner edge and outer edge, which portion will have a minimum surface with respect to the complete surface of the faces; thus the silicon wafer will be properly located, and the possibilities of contaminating it will be reduced to a minimum, since the peripheral wafer portions contacting the inner surface of the container are not used for making the integrated circuits.

With respect to the capability of generating a vacuum in the container, a vacuum is formed by arranging the container in a plastics bag or the like means, evacuating the bag so as to cause the vacuum in the container through the opening formed through the central surface of the container.

In this connection it should be pointed out that the material of the container, that is polycarbonate, provides the desired antistatic characteristics.

BRIEF DESCRIPTION OF THE DRAWINGS

The invention will become more apparent from the following description, with reference to the accompanying drawings.

DETAILED DESCRIPTION OF THE PREFERRED EMBODIMENT

Figure 1:
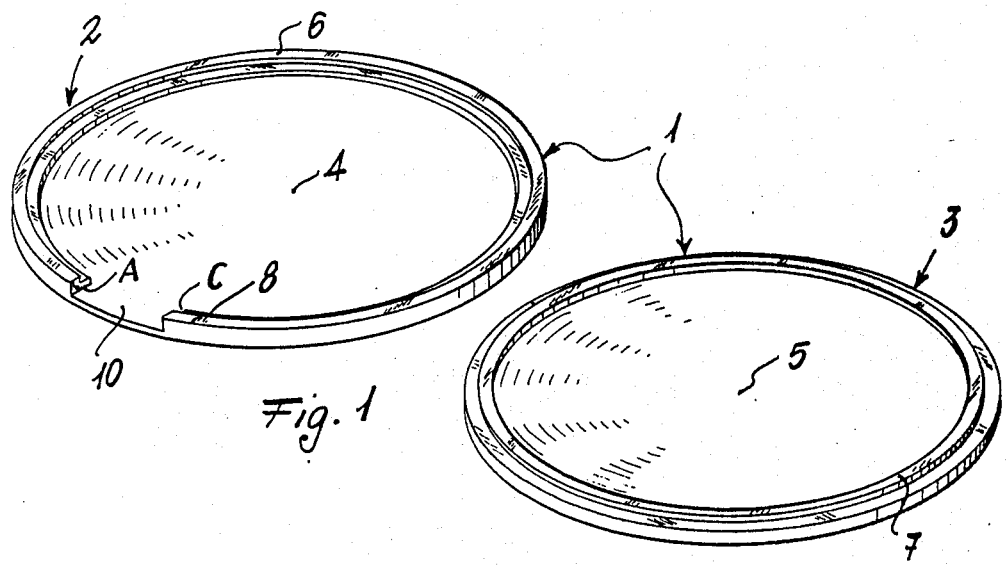
FIG. 1 is a perspective view, from the top, of the container defining portions, which are arranged in an adjoining relationship.
Figure 2:
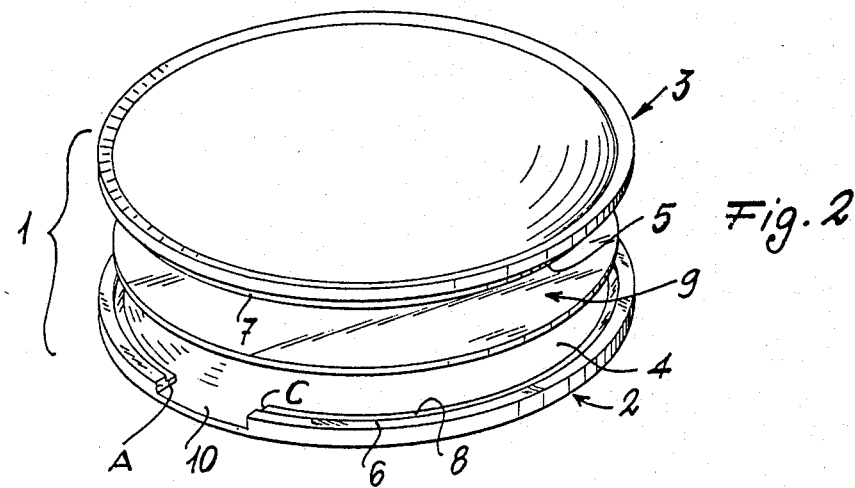
FIG. 2 is an exploded perspective view of the portions of the container, holding a silicon wafer therein.
Figure 3:
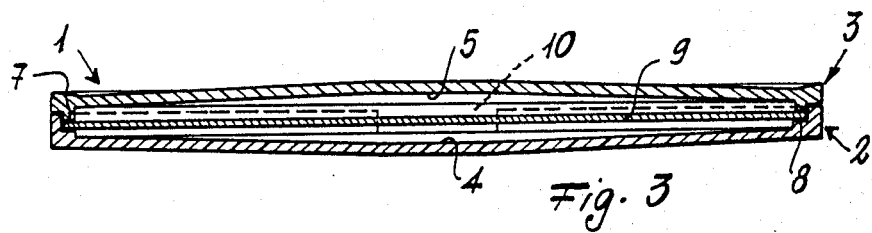
FIG. 3 is a cross-sectional view of the container, i a closed condition, and a wafer held therein.
Figure 4:
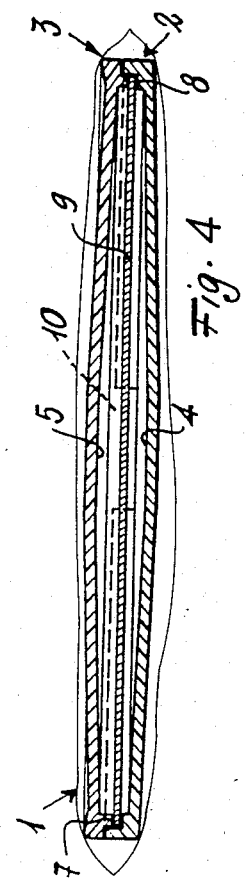
FIG. 4 is a view of the container shown in an outer packaging.

With reference to the figures, the container, indicated generally by the reference number 1, comprises two circular removable portions 2,3 having bulged top and bottom faces 4,5. The circular portions are provided with raised circumferential edges 6,7 which are either arranged on the outer circumference, edge 6, or slightly inside it, edge 7. The height of the edge 7, moreover, is smaller than that of the edge 6. On the top face 4 of the circular portion 2 there is circumferentially arranged, within the outer edge 6, an inner edge 8 contacting the outer edge 6 and having a smaller height than that of the outer edge.

On the inner 8 and outer 7 edges will rest the peripheral portion of a silicon wafer 9 without any other contact point with the container.

Thus, the contamination possibilities will be greatly reduced with respect to conventional wafer containers.

Moreover the container according to the present invention has a good mechanical resistance and satisfactory antistatic properties.

Moreover, the edges 6 and 8 of the face 4 of the portion 2 are interrupted at the point A and continue at C, arranged at a small distance from A, thereby providing, with the container in an assembled condition, an opening 10 through the side surface of the container.

By packaging the container and evacuating the packaging bag, owing to the provision of the mentioned opening, a vacuum will be formed inside the container too. The bulged shape of the faces 4 and 5 prevents the faces from deflecting so as to contact the wafer during the evacuating step.

I claim:

1. A container designed for vacuum holding and transporting a silicon wafer, the container comprising:
   an upper circular portion having an outwardly bulged upper face, the upper circular portion having an outer raised edge near the periphery thereof,
   a lower circular portion having a circumference which is substantially the same as that of the other circular portion, the lower circular portion having an outwardly bulged lower face, the lower circular portion further comprising an outer raised edge near the periphery thereof and an inner raised edge of lesser height than the outer raised edge, and an opening comprising a break in the inner and outer raised edges of the lower circular portion,
   the upper and lower circular portions being adapted to form the closed container with the outer raised edge of the upper circular portion being substantially radially adjacent the inner raised edge of the lower circular portion, the edge of the wafer being located in use between said outer and inner raised edge of the upper and lower circular portion respectively.

2. A container as contained in claim 1 wherein the outer raised edge of the upper circular portion of a lesser height than the outer raised edge of the lower circular portion.

3. A container as claimed in claim 1 wherein the outer raised edge of the upper circular portion has a smaller diameter than the outer raised edge of the lower circular portion.

4. A container as claimed in claim 1 wherein the inner edge of the lower circular portion is of lesser height than the outer edge thereof, the inner and outer edges being directly adjacent each other.

5. A container as claimed in claim 1, the container being located in an outer packaging, whereby evacuation of air from the packaging results in the concomitant vacuuming of the container through the opening.

* * * * *

UNITED STATES PATENT AND TRADEMARK OFFICE
CERTIFICATE OF CORRECTION

PATENT NO. : 4,886,162
DATED     : December 12, 1989
INVENTOR(S) : Ambrogio Sala It is certified that error appears in the above-identified patent and that said Letters Patent is hereby corrected as shown below:

On the title page inventor should read

--(75) Inventor: Ambrogio Sala--.

Signed and Sealed this

Ninth Day of October, 1990

Attest:

HARRY F. MANBECK, JR.

Attesting Officer

Commissioner of Patents and Trademarks